United States Patent [19]
Barnes et al.

[11] Patent Number: 5,892,198
[45] Date of Patent: Apr. 6, 1999

[54] METHOD OF AND APPARATUS FOR ELECTRONICALLY CONTROLLING R.F. ENERGY SUPPLIED TO A VACUUM PLASMA PROCESSOR AND MEMORY FOR SAME

[75] Inventors: Michael S. Barnes, San Francisco; John Patrick Holland, Santa Clara, both of Calif.

[73] Assignee: LAM Research Corporation, Fremont, Calif.

[21] Appl. No.: 624,121

[22] Filed: Mar. 29, 1996

[51] Int. Cl.$^6$ ..................................................... B23K 10/00
[52] U.S. Cl. ........................ 219/121.54; 219/121.43; 219/709
[58] Field of Search ........................... 219/121.43, 121.4, 219/121.44, 709, 716, 745, 121.54, 121.57; 356/316; 156/345

[56] References Cited

U.S. PATENT DOCUMENTS

| | | | |
|---|---|---|---|
| 4,673,589 | 6/1987 | Standley | 427/41 |
| 5,179,264 | 1/1993 | Cuomo et al. | 219/121.43 |
| 5,223,457 | 6/1993 | Mintz et al. | 437/225 |
| 5,321,222 | 6/1994 | Bible et al. | 219/745 |
| 5,383,019 | 1/1995 | Farrell et al. | 356/316 |
| 5,521,360 | 5/1996 | Johnson et al. | 219/709 |

*Primary Examiner*—Mark H. Paschall
*Attorney, Agent, or Firm*—Lowe Hauptman Gopstein Gilman & Berner

[57] ABSTRACT

A load including a plasma discharge in a plasma processing chamber is matched to a variable frequency source so the power reflected from the load is substantially minimized. The source voltage or a variable reactance of a matching network between the source and load is controlled so the load has a preset power level, as detected by the difference between the source output power and the power reflected from the load.

31 Claims, 3 Drawing Sheets

METHOD OF AND APPARATUS FOR ELECTRONICALLY CONTROLLING R.F. ENERGY SUPPLIED TO A VACUUM PLASMA PROCESSOR AND MEMORY FOR SAME

FIELD OF INVENTION

The present invention relates generally to vacuum plasma processing devices and more particularly to a plasma processing method and apparatus including an impedance matching network driven by an AC source having a frequency controlled as a function of power reflected from a load including a vacuum plasma processing chamber. A further aspect of the invention is to provide a new and improved controller wherein the amount of power supplied to a load including a discharge of a vacuum plasma processing chamber is automatically controlled.

BACKGROUND ART

Vacuum plasma processing chambers are employed for processing workpieces, typically glass, semiconductor or metal substrates, so the workpiece is etched and/or has materials deposited thereon. Significant amounts of power must be supplied to the vacuum plasma processing chamber to excite ions in a gas in the chamber to a plasma and to maintain the plasma in a discharge state.

The impedance of a load of the vacuum plasma processing chamber, including the plasma discharge and an excitation circuit component for it, usually a coil or one or more electrodes, frequently varies, non-linearly and unpredictably. For example, the quality factor (Q) of an excitation coil prior to ignition of the plasma is typically quite high, about 1,000. After ignition, the Q of the coil and its plasma load drops to about 10–20 when the coil is not close to being resonated. As resonance is approached, the Q of the coil and plasma drops to a lower value because the resistive impedance seen looking into a matching network driving the coil and plasma becomes a larger percentage of the total impedance seen looking into the matching network. The reactive impedance seen looking into the matching network also decreases as resonance is approached and reached due to properties of the plasma. The resistive impedance results, to a large extent, from the charged carriers in the plasma. Hence, matching to a plasma presents particular problems due to these variations in the resistive (real) and reactive (imaginary) impedance components of the load seen looking into the matching network driving the excitation circuit element and plasma of a vacuum plasma processing chamber. These variations often include fairly high frequency components, for example, in the audio frequency range.

Usually the plasma of a vacuum plasma processing chamber has been excited to a single r.f. frequency, such as 13.56 mHz, by a relatively high power r.f. source connected to the load via a variable impedance matching network. Two or more variable impedances of the matching network have usually been provided, one primarily controlling the load reactive component and the other primarily controlling the load real, i.e., resistive, component, as seen by the source.

The variable impedance elements of the matching network must be relatively robust because relatively large r.f. currents and voltages are applied to them. Hence, the variable reactances of the matching network are usually controlled by servo controllers including motors having relatively slow response times, incapable of following many changes in the reactive impedance of the load including the discharge. The prior art controller time constants are typically in the 0.1 to 1 second range, to prevent the matching network variable reactances from adjusting properly to load transients or perturbations which occur at audio frequencies on faster time scales than 0.1 to 1 second. This problem is particularly acute because of the frequent need to repeatedly vary both reactances of the matching network.

It is, accordingly, an object of the present invention to provide a new and improved apparatus for and method of controlling power supplied to a plasma discharge of a vacuum plasma processing chamber.

Another object of the invention is to provide a new and improved method of and apparatus for substantially eliminating reactive components seen by a source exciting a plasma discharge of a vacuum plasma processing chamber.

A further object of the invention is to provide a new and improved method of and apparatus for varying a parameter of an excitation circuit for a vacuum plasma processing chamber in such a manner that reactive impedances seen by a source exciting a plasma discharge of the chamber are substantially eliminated, even when changes in the reactive impedance occur at audio frequencies.

An additional object of the invention is to provide a new and improved all-electronic, low power method of and apparatus for controlling the reactive impedance seen by a source exciting a plasma discharge of a vacuum plasma processing chamber.

Yet another object of the invention is to provide a new and improved method of and apparatus for controlling the amount of power exciting a plasma discharge of a vacuum plasma processing chamber while substantially eliminating reactive impedance effects seen by a source exciting the plasma discharge.

Still a further object of the invention is to provide a new and improved method of and apparatus for controlling the amount of power exciting a plasma discharge of vacuum plasma processing chamber so a desired power level is applied to the load even though power from the load is reflected back to an excitation power supply.

BRIEF DESCRIPTION OF THE INVENTION

These and other objects of the invention are achieved by matching a load including a plasma discharge in a vacuum plasma processing chamber to an r.f. source that supplies sufficient power to the discharge to excite and maintain the discharge. The method is performed with a variable frequency r.f. source that drives the discharge via a matching network. The frequency of the source is adjusted in response to a function of energy reflected from the matching network. In one embodiment, the reflected energy is directly minimized by measuring reflected power; in a second embodiment, the reflected energy function is preferably a minimum phase displacement between the voltage and current supplied by the source to a cable driving the matching network, excitation circuit element and plasma. Adjusting the voltage and current so they are substantially in phase with each other substantially eliminates the load reactive component. Since frequency of the source can be controlled electronically, at low power, with no moving parts, audio frequency load variations are easily compensated and reactive effects thereof on the power delivered to the load are substantially eliminated. Because the source frequency is varied to achieve matching, reactances included in the matching network can, in one embodiment, be maintained at the same value while matching is being performed.

In accordance with a further aspect of the invention the source is also controlled so a predetermined amount of power is delivered to the load including the discharge. Control of the frequency and power derived by the source is simultaneous in one embodiment; in another embodiment, power level is controlled after the source frequency has been stabilized.

In another embodiment of the invention, the frequency of the source is controlled and one matching network impedance, preferably the so-called load impedance, is controlled.

The source delivered power or the load impedance of the matching network is preferably controlled by comparing the power supplied by the source to the matching network and the power reflected from the discharge back to input terminals of the matching network. An indication of the relative values of the supplied and reflected powers is combined with a set point value for the load power to control the amount of power derived from the source or the value of the matching network impedance. Power is controlled completely electronically with no moving parts, at low power, by varying the amplitude of the variable frequency signal supplied to a power amplifier in the source.

In accordance with a further aspect of the invention a load including a plasma discharge in a vacuum plasma processing chamber is matched to an r.f. source that supplies sufficient power to the discharge to excite and maintain the discharge. The method is performed with a variable frequency r.f. source that drives the discharge via a matching network and comprises adjusting the frequency of the source until the reactive component, seen looking away from the source, is minimized.

Another aspect of the invention relates to the combination of: a vacuum plasma processing chamber for generating a plasma discharge for treating a workpiece; a variable frequency r.f. source for deriving sufficient power to excite and maintain the discharge; a matching network connected between the r.f. source and load including the plasma of the discharge chamber; and a controller responsive to a function of the power reflected from the matching network for controlling the frequency supplied by the source to the matching network.

In one embodiment, the controller includes a detector for power reflected back to the source, while in a second embodiment the controller includes an electronic phase detector for deriving a first signal indicative of the phase difference between the voltage and current at the source output, and a proportional-integral controller responsive to the first signal for deriving a second signal. The variable frequency oscillator, in the form of a voltage controlled oscillator, responds to the second signal so the second signal controls the frequency derived by the oscillator.

A further aspect of the invention relates to a combination including: a vacuum plasma processing chamber for generating a plasma discharge for treating a workpiece; an AC source for deriving sufficient power to excite and maintain the discharge; a matching network connected between the AC source and load including the plasma of the discharge chamber; and a controller responsive to the amount of power supplied by the source to the matching network and the amount of power reflected back to output terminals of the source from a load including the discharge for maintaining the amount of power supplied to the load equal to a set point. The controller is preferably digital and includes a memory.

According to still another aspect of the invention, a memory for use in controlling the frequency of a source driving a plasma discharge of a vacuum plasma processing chamber via an excitation impedance and a matching network comprises programmed elements storing signals that change the source frequency until minimum power is reflected back to the source from the plasma discharge, the excitation impedance and the matching network.

The above and still further objects, features and advantages of the present invention will become apparent upon consideration of the following detailed descriptions of specific embodiments thereof, especially when taken in conjunction with the accompanying drawings.

DESCRIPTION OF THE PREFERRED EMBODIMENT

Figure 1:
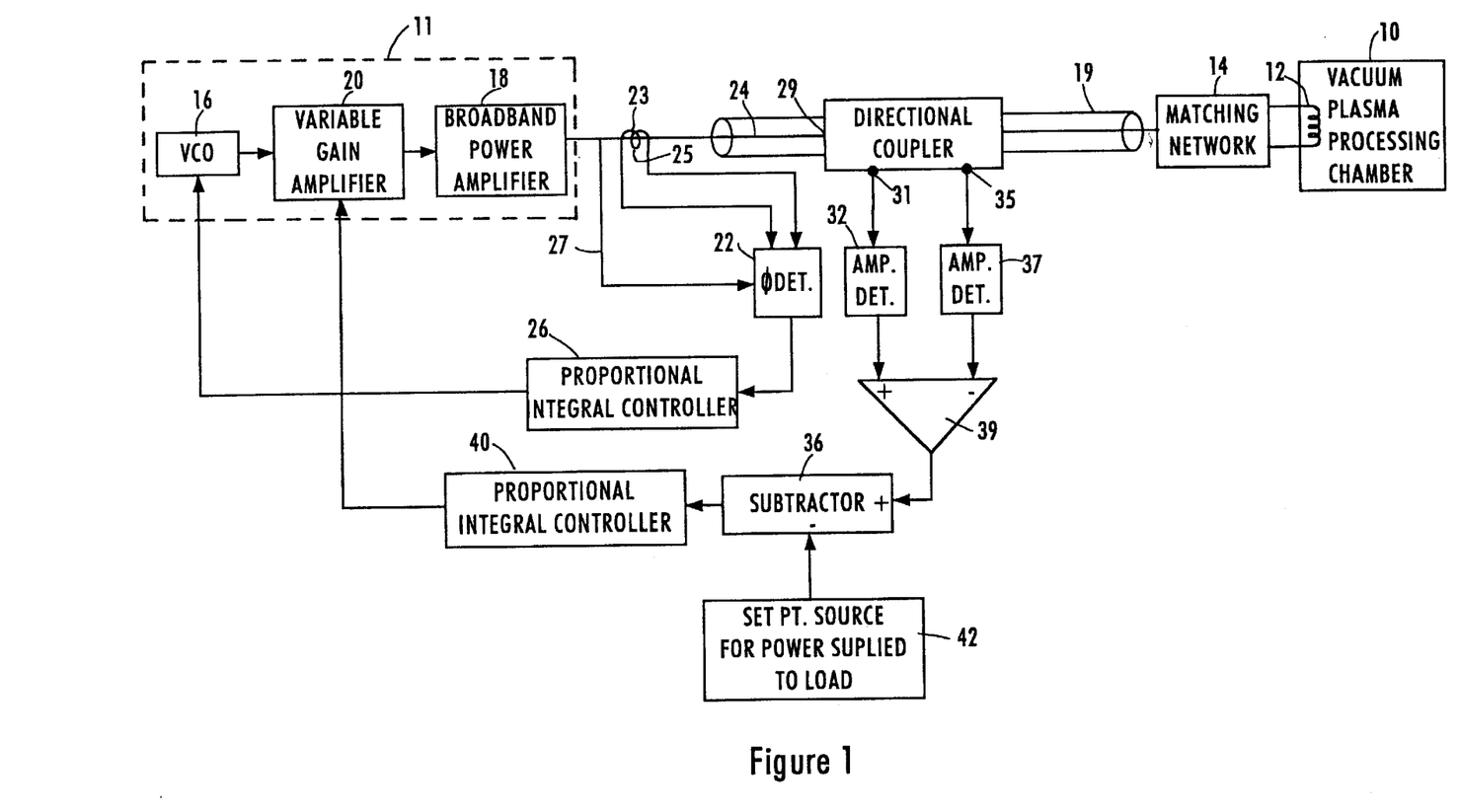
FIG. 1 is a block diagram of an embodiment of the invention including a matching network having only fixed impedances and a phase detector controls the frequency of a variable frequency source.

Reference is now made to FIG. 1 wherein there is illustrated conventional vacuum plasma etching and/or deposition chamber 10. Chamber 10 includes a workpiece (not shown) which is etched by a plasma discharge in vacuum chamber 10; alternatively, the workpiece has material from the plasma in chamber deposited thereon. Gaseous ions in chamber 10 are excited to and maintained in the plasma state by a suitable excitation circuit component, such as coil 12, in a conventional manner as disclosed, for example, by Ogle, U.S. Pat. No. 4,948,458. Alternatively, the plasma in chamber 10 is excited by two or more electrodes.

Coil 12 is driven by an r.f. electric wave having a relatively high power, as derived from r.f. source 11. Source 11 drives coil 12 via r.f. cable 19 and resonant matching network 14, which in a preferred embodiment has only fixed components and no variable components. This is in contrast to the typical prior art variable impedance matching networks used to excite and maintain vacuum plasma processing chamber discharges. For plasma excitation by coil 12, network 14 can be configured as a "T" network having a pair of series capacitors and a shunt capacitor connected to a tap between the series capacitors. Resonance is provided by the coil in such an instance. For electrode excitation of the plasma in chamber 10 (instead of excitation by coil 12), the matching network includes a coil connected in series with the electrodes and one of the series capacitors.

To enable matching network 14 to include only fixed components, while minimizing or eliminating reactive impedance effects of the load (including the discharge and coil 12), the matching network is driven by a variable frequency, high power r.f. wave derived from source 11. Typically, the frequency of the wave applied to fixed matching network 14 is in the range of about 12–15 mHz. The frequency of the r.f. wave applied to fixed matching network 14 is controlled so the power reflected from network 14 back to source 11, through network 14 and cable 19, is minimized.

The reflected power is a minimum when the difference between the phases of voltage and current components of the wave reflected back to output terminals of source 11 to matching is minimized, i.e., when the reflected current and voltage are substantially in phase with each other. Such control over the frequency of the r.f. wave applied to matching network 14 assists in providing a match between source 11 and the load impedance of chamber 10 to promote efficient transfer of energy from the source to the load. The load impedance of chamber 10 is subject to relatively rapid variations which can easily be tracked by changing the frequency of the wave applied to network 14.

To these ends, source 11 includes electronic voltage controlled oscillator 16, having a variable frequency r.f. output supplied to broadband power amplifier 18 via variable gain low power amplifier 20. Each of amplifiers 18 and 20 has a relatively constant amplitude versus frequency response over the entire range of the output of oscillator 16. Amplifier 18 has a resistive output impedance such that the impedance driving cable 19 and fixed matching network 14 is equal to the impedance seen looking into the cable and fixed matching network when the frequency of oscillator 16 and the load impedance formed by coil 12 and the plasma discharge in chamber 10 have nominal values.

In the embodiment of FIG. 1 the frequency of voltage controlled oscillator 16 is controlled so the reactive impedance seen by looking from the output terminals of source 11 into the input terminals of cable minis minimized. Conventional electronic phase detector 22 compares the phase of the r.f. voltage across the output terminals of amplifier 18 with the phase of the r.f. current supplied by source 11 to cable 19. The current supplied to cable 19 is monitored by threading ferrite coil 23 through lead 24 of cable 19. Lead 24 is a one turn primary winding of a transformer including ferrite core 23. Secondary winding 25 on core 23 has a voltage induced in it directly proportional to the current flowing from source 11 into cable 19. The AC voltage across winding 25 is supplied to one input of phase detector 22, having a second input on lead 23 responsive to an output of amplifier 18 which is a replica of the r.f. voltage supplied by source 11 to cable 19. Phase detector 22 derives a DC output voltage indicative of the difference in phase between the current flowing in lead 24 of cable 19 and the power supplied by source 11 to cable 19, network 14 and chamber 10.

The DC output voltage of detector 22 is supplied to conventional electronic integral-proportional controller 26. Controller 26 derives a DC voltage, supplied to the control input terminal of voltage controlled oscillator 16. Phase detector 22 and controller 26 are constructed so a positive voltage is supplied by the controller to voltage controlled oscillator 16 in response to the phase of the current supplied by source 11 to cable 19 leading the phase of the voltage across the source 11 output terminals; in response to the phase of the current lagging the voltage derived by source 11, controller 26 supplies a negative DC voltage to oscillator 16. In response to the current and voltage supplied to cable 19 being in-phase, the voltage supplied by proportional integral controller 26 to oscillator 16 remains constant. Thereby, the frequency of oscillator 16 is increased by an amount proportional to the phase difference between the current and voltage supplied to cable 19 by source 11 when the current leads the voltage; the frequency of oscillator 16 is decreased by an amount proportional to the difference between the current and voltage supplied to cable 19 by source 11 when the current lags the voltage; there is no change in the frequency of oscillator 16 when the current and voltage supplied by source 11 to cable 19 are the same.

Because the frequency of oscillator 16 is controlled so the voltage and current supplied by source 11 to cable 19 are in phase, the reactance component of the load including the discharge in chamber 10 and coil 12 seen by source 11, which excites and maintains the discharge, is eliminated. Variations in the reactive component of the load, due principally to non-linearities in the discharge in chamber 10 at audio frequencies and below are easily tracked by varying the frequency of oscillator 16. This is because the control for the frequency of oscillator 16 can be all electronic, including electronic phase detector 22, electronic proportional integral controller 26 and electronic voltage controlled oscillator 16, having a variable, solid state variable capacitor, in the form of a varactor. Since all of phase detector 22, controller 26 and voltage controlled oscillator 16 are low power elements, having low current requirements, the control is provided without the need for bulky, expensive devices having relatively long time constants, frequently incapable of following audio frequency variations in the reactive impedance of the load including the discharge in chamber 10.

It is also desirable to control the power supplied by source 11, including oscillator 16, variable gain amplifier 20 and broadband power amplifier 18, to the load including the discharge in chamber 10 and coil 12. The power supplied to the load is subject to change and is not necessarily equal to the power derived from source 11 because of mismatches between the source drive impedance and the impedance of the load, despite the presence of matching network 14 and the variable frequency of source 11. However, the real impedance component mismatch (i.e., the resistive component of the impedance at the output of source 11 relative to the resistive component seen by looking into the input terminals of cable 19) is far less sensitive to load impedance variations caused by changes in the discharge properties of chamber 10, than the reactive impedance mismatch. The reactive impedance mismatch results from the difference between the imaginary impedance component seen looking into the output of source 11 compared to the imaginary impedance seen looking into the input terminals of cable 19. The real impedance mismatch is far less sensitive to the load impedance changes than the reactive impedance mismatch because of the relatively high Q of the load including coil 12 and the discharge of chamber 10.

One technique that could be used to control the power supplied to the load including coil 12 and the discharge of chamber 10 is to measure the real impedance components looking into cable 19 and into the output terminals of source 11 and adjusting the output impedance of source 19 until the source output and cable input impedances are equal. However, this is somewhat difficult and an easier way to resolve the problem has been developed.

In the embodiment of FIG. 1, the difference between the output power of source 11 and the power reflected back to the input terminals of cable 19 connected to source 11 is monitored using equipment included in many currently available excitation sources for vacuum plasma processing chambers. The difference between the output power of source 11 and the power reflected back to the input terminals of cable 19 connected to source 11 is combined with a set point for the desired power to be supplied to the load to activate a controller for the gain of variable gain amplifier 20.

To this end, the controller of FIG. 1 contains directional coupler 30 including a first input port 29 responsive to the output power of broadband amplifier 18, at the output of source 11, and a second input port 33 responsive to the power reflected back to the output terminals of source 11 by cable 19. Directional coupler 30 includes first and second r.f. output ports 31 and 35, respectively deriving r.f. signals having amplitudes directly proportional to the output power of source 11 and the power reflected by cable 19 back to the output terminals of source 11. The amplitudes of the r.f. outputs at ports 31 and 35 are respectively detected by amplitude detectors 32 and 37. Detectors 32 and 37 respectively derive first and second low power DC signals indicative of the output power of source 11 and the power reflected to the output terminals of source 11. The DC outputs of amplitude detectors 32 and 37 are respectively supplied to non-inverting and inverting input terminals of feedback operational DC difference amplifier 39 which derives a DC output voltage directly proportional to the difference between the output and reflected powers, i.e. amplifier 39 compares the forward and reflected powers. This difference represents the power actually supplied to the load.

To control the power supplied to the load, the output of differential amplifier 39 is compared with a set point for the power of the load, as derived from set point source 42. The comparison is performed in subtractor 36, having a subtrahend input responsive to the output of set point source 42 and a minuend input responsive to the output of amplitude detector 32. If there is a match between the output impedance of source 11 and the impedance looking into cable 19 from source 11 so there is no reflected power back to the input terminals of the matching network while source 11 is delivering the set point power to the output of amplifier 18, the output of subtractor 36 is zero and there is no change in the power derived from source 11. If, however, there is a mismatch and there is reflected power from cable 19 at the output terminals of source 11 or there is a match but the power consumed by the load differs from that of the set point, subtractor 36 derives a finite, non-zero output. The output of subtractor 36 is supplied to electronic proportional-integral controller 40, having an output that is supplied as a variable gain control signal to variable gain amplifier 20.

As the reflected power from cable 19 at the output terminals of source 11 increases, controller 40 correspondingly increases the gain of amplifier 20 to increase the power supplied by source 11 via cable 19 and matching network 14 to the load including the discharge of chamber 10 and coil 12. Controller 40 rapidly increases the gain of amplifier 20 until the set point for the power of the load, as established by set point source 34, is reached because of the all electronic, low power nature of the control. Similarly, but in an opposite manner, if the reflected power from cable 19 at the output terminals of source 11 decreases, controller 40 decreases the gain of amplifier 20, to reduce the amount of power supplied by source 11 to fixed matching network 14 until the set point of source 34 is again reached.

Figure 2:
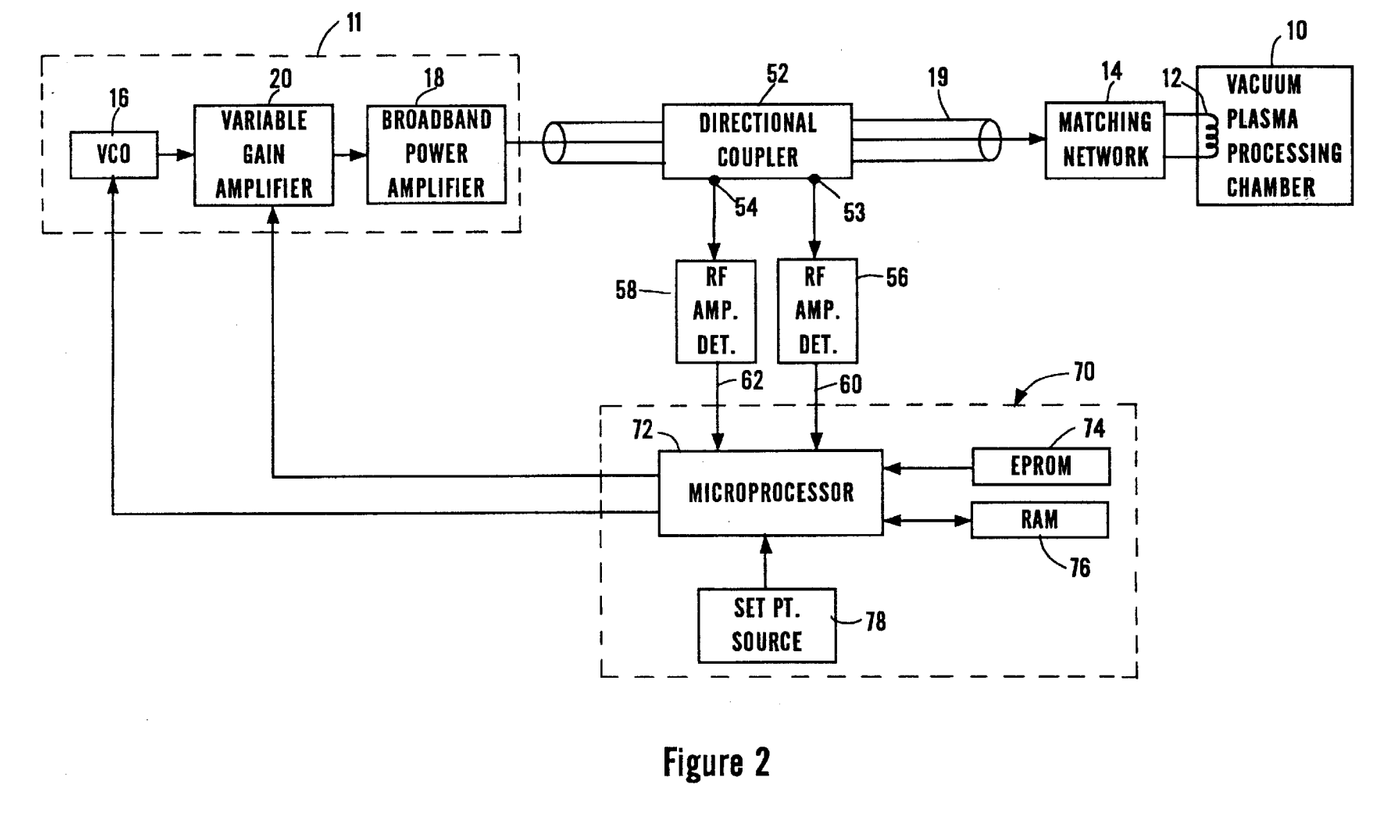
FIG. 2 is a block diagram of an embodiment of the invention including a matching network having only fixed impedances and a reflected power detector controls the frequency of a variable frequency source.

Reference is now made to FIG. 2 of the drawing wherein r.f. source 11 is connected by cable 19 to vacuum plasma discharge processing chamber 10 via fixed impedance matching network 14. Source 11, having a substantial output power sufficient to excite and maintain the plasma discharge in chamber 10 (on the order of 3 kW), includes low power voltage controlled oscillator 16, broadband power amplifier 18 and low power, variable gain amplifier 20, connected between the output of the oscillator and the input of the power amplifier.

The frequency of oscillator 16 is controlled so the power reflected by cable 19 back to source 11 is minimized to achieve impedance matching between source 11 and a load including plasma excitation coil 12 and the plasma discharge of chamber 10. The discharge of chamber 10 is subject to substantial unpredictable impedance variations that can occur at audio frequencies. The output power of source 11 is controlled by varying the gain of low power amplifier 20 whereby the voltage input and power output of power amplifier 18 increase and decrease as the gain of amplifier 20 respectively increases and decreases. The output power of source 11 is such that a predetermined set point power is supplied by the source to the load at the input terminals of cable 19. The gain of amplifier 20 is adjusted to a value determined by the set point for the load power, and the difference between the output power of source 11 (forward power) and the power reflected from cable 19 back to the output terminals of source 11. The frequency of oscillator 16 and the gain of amplifier 20 can be controlled simultaneously or control of the gain of amplifier 20 can follow adjusting the frequency of oscillator 16, i.e., after matching.

To these ends, directional coupler 52 is coupled to the leads of cable 19 immediately adjacent output terminals of source 11. Coupler 52 derives, at its output ports 53 and 54, responses indicative of the power (1) reflected back to the output terminals of source 11 from cable 19 and network 14 and (2) supplied by source 11 to cable 19. The r.f. responses at terminals 53 and 54 are converted into variable DC voltages by r.f. amplitude detectors 56 and 58 that derive DC output signals on leads 60 and 62 respectively proportional to the power (1) reflected from matching network 14 and cable 19 back to the output terminals of source 11 and (2) supplied by source 11 to cable 19, i.e. forward power.

The DC voltages on leads 60 and 62 are supplied to digital controller 70, including microprocessor 72, programmed memory 74, typically a programmable read only memory (EPROM), and a random access memory (RAM) 76. Microprocessor 72 includes an analog to digital converter that responds to the voltages on leads 60 and 62 to derive digital signals having values determined by the amount of reflected and forward power. Microprocessor 72 responds to the digital signals indicative of reflected and forward power and signals from programmed memory 72 to derive digital signals that are stored in RAM 76 to control the output power of source 11 and the frequency of source 11.

Memories 74 and 76 control microprocessor 72 so the microprocessor derives a digital signal that controls the frequency of oscillator 16 to minimize reflected power. Microprocessor 72 converts the digital signal into an analog signal that is supplied to a variable low power reactance, typically a varactor, i.e., variable capacitor (not shown) of oscillator 16. Memories 74 and 76 also control microprocessor 72 so the microprocessor derives a digital signal to control the output power of source 11 so the power delivered to the load has a set point value, determined by (1) the value of digital set point input signal source 78 connected to microprocessor 72 and (2) the difference between the reflected and forward powers as indicated by the signals on leads 60 and 62. Microprocessor 72 converts the digital signal that controls the output power of source 11 into an analog signal that controls the gain of amplifier 20 and the output power of power amplifier 18.

Initially, microprocessor 72 responds to a control signal from memory 74 to set the frequency of oscillator 16 and value of the variable impedance element of oscillator 16 at center values in their range of values. Microprocessor 72 responds to signals on lead 60 and stored in memories 74 and 76 to control the frequency and value of the variable impedance of oscillator 16 in a heuristic manner in response to successive indications of reflected power on lead 60 until the reflected power is minimized, i.e. the signal on lead 60 has a minimum value. Immediately after derivation of the first reflected power indication, microprocessor 72 responds to a control signal from memory 74 to increment the value of the variable impedance of oscillator 16 in a positive direction by a fixed amount to reduce the oscillator frequency. Microprocessor 72 then monitors the indication of reflected power on lead 60. Microprocessor 72 then responds to a control signal from memory 74 and a data signal from memory 76 to determine if the reflected power has decreased or increased as a result of the positive step change in the value of the variable impedance of oscillator 16. If microprocessor 72 determines that the reflected power decreased, the microprocessor again positively increments the value of the variable impedance by a fixed step. Microprocessor 72 then again responds to signals on lead 60 and from memories 74 and 76 to determine if the reflected power is less than the reflected power detected during the previous step. If microprocessor 72 determines the reflected power is again less than the previous reflected power, the microprocessor again positively increments the value of the variable impedance of oscillator 16 by one step. Microprocessor 72 continues operation in this manner until the microprocessor determines an increase in the voltage on lead 60, i.e. an increase in reflected power at the present measuring step relative to the detected reflected power during the immediately preceding prior step. In response to microprocessor 72 detecting an increase in reflected power after a positive step change in the value of the variable impedance of source 16, memory 74 controls the microprocessor to decrement the variable impedance value by one step. Usually, this operation results in the reflected power decreasing again. The value of the variable impedance of source 16 is controlled in this way until the reflected power is minimized.

However, if the initial positive step change in the value of the variable impedance of oscillator 16 causes the detected reflected power on lead 60 to increase, microprocessor 72 responds to a program control signal from memory and a data signal from memory 76 to negatively increment the variable impedance of oscillator 16 by one step to increase the oscillator frequency by a step. Microprocessor 72 then responds to the reflected signal on lead 60 and the program and data signals from memories 74 and 76 in the same manner described supra, until reflected power is minimized as a result of the stepwise changes in the impedance of oscillator 16. When reflected power is minimized the best possible impedance match exists between source 11 and the load comprising coil 12 and the discharge of chamber 10. Hence there is a minimum reactive impedance seen by source 11 looking into cable 19 at the variable controlled frequency of oscillator 16, i.e. impedance matching of source 11 to the load is achieved relatively rapidly by varying only a low power impedance of variable frequency, voltage controlled oscillator 16. Because the reflected power seen looking into matching network 14 is minimized, there is no substantial reactive impedance seen looking into the matching network so the current and voltage supplied to the network are substantially in phase.

After microprocessor 72 has controlled the frequency of oscillator 16 to achieve minimum reflected power as indicated, the microprocessor responds to signals on leads 60 and 62 and from set point source 78 as well as memories 74 and 76, to control the power supplied by source 11 to the load of discharge chamber 10, including coil 12 and the plasma in the chamber to the set point value. To monitor the power actually supplied to the load to a set point value, microprocessor 72 determines the difference between the output power of source 11 and the power reflected from cable 19 back to source 11. The difference between the forward and reflected power is an indication of the actual power consumed by the load. It is generally preferable to stabilize the power supplied to the load after the frequency of source 16 has been stabilized because of difficulties in simultaneously adjusting two control loops. In addition, since adjustments in the frequency of oscillator 16 control the amount of power reflected from network 14 back to cable 19, it is inefficient, from a time standpoint, to adjust load power before an impedance match is reached.

To these ends, after microprocessor 72 stabilizes the frequency of oscillator 16, the microprocessor responds to the digital set point input signal of source 78, having a value, $P_s$ commensurate with a desired value for the power to be supplied to the load of chamber 10. Microprocessor 72 responds to program signals in memory 74 to compare set point value, $P_s$ by a subtraction process, with the actual power delivered to the load, as indicated by $(P_f-P_r)$ where $P_f$ is the power supplied by source 11 to cable 19, as indicated by the DC voltage on lead 62, and $P_r$ is the power reflected by the cable to the source output terminals, on lead 60. The values of data signals representing $P_s$, $P_f$ and $P_r$ are retrieved from memory 76, where they were previously stored. Microprocessor 72 then derives a digital gain control signal for amplifier 20. Microprocessor 72 converts the digital gain control signal into an analog signal that causes the gain of amplifier 20 to be set so the output power of source 11 is $P_s=(P_f-P_r)$, i.e. $P_s-(P_f-P_r)=0$.

Preferably, memory 74 stores a proportional-integral program to control microprocessor 72 to be responsive to $P_s$, $P_f$, and $P_r$ so the microprocessor derives an output signal for controlling the gain of amplifier 20.

It is to be understood that heuristic control of the variable impedance and frequency of oscillator 16 is not always necessary. Instead a proportional-integral control can be employed for the frequency of oscillator 16, similar to the control of FIG. 1. In addition, heuristic control of variable gain amplifier 20 in response to $P_s$, $P_f$ and $P_r$ is possible to achieve the relation $P_s-(P_f-P_r)=0$.

In accordance with a further embodiment of the invention, the frequency of oscillator 16 of source 11 is controlled and a matching network connected between cable 19 and coil 12 includes one variable reactance. One arrangement in accordance with this embodiment is illustrated in FIG. 3, a modification of the embodiment illustrated in FIG. 2.

Figure 3:
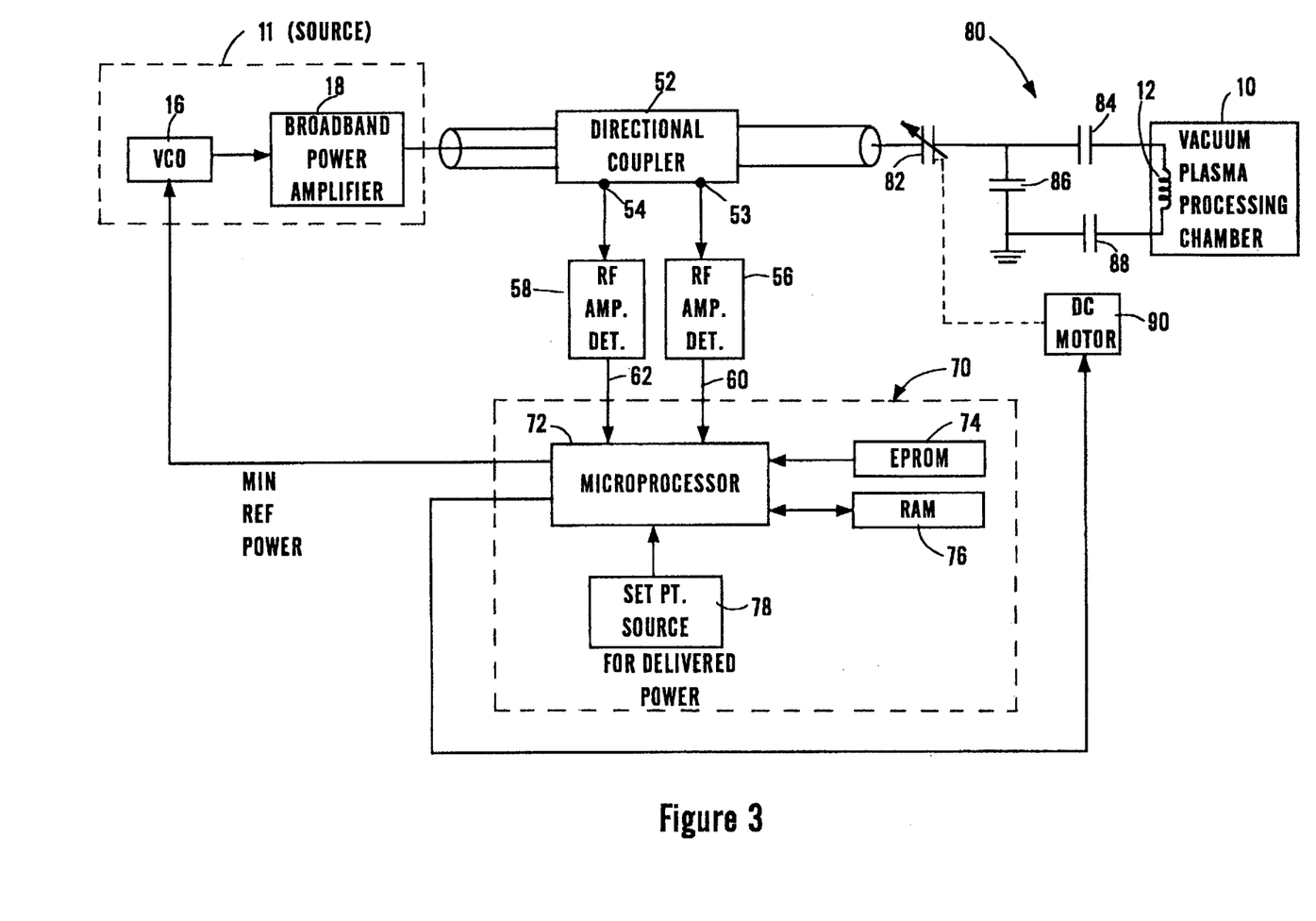
FIG. 3 is a block diagram of an embodiment of the invention including a matching network having a variable impedance controlled so a predetermined power level is delivered to a plasma processor load and frequency of a variable frequency source is controlled so power reflected from the load is minimized.

In FIG. 3, the frequency of oscillator 16 of source 11 is controlled in response to the output of microprocessor 72 indicative of minimum reflected power. In addition, "T" matching network 80 includes series connected variable load capacitor 82 and fixed time capacitor 84, having a common connection to one electrode of shunt capacitor 86, the other electrode of which is grounded. Opposite terminals of coil 12 are respectively connected to one electrode of each of capacitors 84 and 88; the other electrodes of capacitors 84 and 88 are respectively connected to opposite electrodes of capacitor 86.

The value of capacitor 82 is controlled by DC a motor 90, in turn responsive to an output of microprocessor 72 similar to the microprocessor output that controls the gain of variable gain amplifier 20 in the embodiment of FIG. 2. Microprocessor 72 supplies motor 90 with a signal for adjusting the value of capacitor 82 to enable the set point for delivered power, as derived from source 78, to be achieved. Because the set point for delivered power is controlled by varying capacitor 82, source 11 does not include a variable gain low power amplifier connected between oscillator 16 and broadband power amplifier 18.

In accordance with a further arrangement (not illustrated), the embodiment of FIG. 3 is modified so oscillator 16 and capacitor 82 are controlled in basically the same manner as the oscillator and variable gain amplifier of FIG. 1 are controlled. The arrangement of FIG. 3 can be modified so the frequency of oscillator 16 is controlled in response to the output of proportional integral controller 26, FIG. 1. In other words, the frequency of oscillator 16 in this arrangement is responsive to the output of phase detector 22, such that the frequency of the oscillator is varied until the two inputs of the phase detector have substantially the same phase. In this modification of FIG. 3, the value of capacitor 82 is varied in response to the output of proportional integral controller 40 so capacitor 82 is set to a value which causes the set point, as derived from source 42, for power supplied by source 11 to the load to be achieved.

While there have been described and illustrated specific embodiments of the invention, it will be clear that variations in the details of the embodiments specifically illustrated and described may be made without departing from the true spirit and scope of the invention as defined in the appended claims.

We claim:

1. A method of matching a load including a plasma discharge processing a workpiece in a vacuum plasma processing chamber to an r.f. source that supplies sufficient power to the discharge to excite and maintain the discharge, the method being performed with a variable frequency r.f. source having a frequency in the low megahertz non-microwave range and that drives a load including the discharge via a matching network, the method comprising adjusting the frequency of the source until there is a minimum power reflected from the load toward the source, indicating the minimum reflected power by measuring the phase angle between the current and voltage supplied by the source to the matching network, and adjusting the frequency until the current and voltage are substantially in phase.

2. The method of claim 1 wherein reactances included in the matching network are maintained at the same value while the matching method is being performed.

3. A method of matching a load including a plasma discharge in a vacuum plasma processing chamber to an r.f. source that supplies sufficient power to the discharge to excite and maintain the discharge, the method being performed with a variable frequency r.f. source that drives a load including the discharge via a matching network, the method comprising adjusting the frequency of the source until there is a predetermined relation for power reflected from the load toward the source, and delivering a predetermined amount of power to the load by controlling the source output power in response to a measure of power reflected from the load back toward the source, the source power being varied only after the frequency supplied to the load has been stabilized.

4. A method of matching a load including a plasma discharge in a vacuum plasma processing chamber to an r.f. source that supplies sufficient power to the discharge to excite and maintain the discharge, the method being performed with a variable frequency r.f. source that drives a load including the discharge via a matching network, the method comprising adjusting the frequency of the source until there is a predetermined relation for power reflected from the load toward the source, and delivering a predetermined amount of power to the load by controlling the source output power in response to a measure of power reflected from the load back toward the source, the source power being controlled by combining indications of the amount of power derived from the source, the amount of power reflected back from the load and a set point value for the load power.

5. A method of matching a load including a plasma discharge in a vacuum plasma processing chamber to an r.f. source that supplies sufficient power to the discharge to excite and maintain the discharge, the method being performed with a variable frequency r.f. source that drives a load including the discharge via a matching network, the method comprising adjusting the frequency of the source until there is a predetermined relation for power reflected from the load toward the source and delivering a predetermined amount of power to the load by controlling a variable impedance of a matching network connected between the source and load.

6. The method of claim 5 wherein the variable impedance is controlled by combining indications of the amount of power derived from the source, the amount of power reflected back from the load and a set point value for the load power.

7. A method of matching a load including a plasma discharge processing a workpiece in a vacuum plasma processing chamber to an r.f. source that supplies sufficient power to the discharge to excite and maintain the discharge, the method being performed with a variable frequency r.f. source in the megahertz non-microwave range that drives a load including the discharge via a matching network, the method comprising adjusting the frequency of the source until there is a minimum reactive component seen looking into the matching network from the direction of the source.

8. The method of claim 7 wherein reactances included in the matching network are maintained at the same value while the matching method is being performed.

9. A method of matching a load including a plasma discharge in a vacuum plasma processing chamber to an r.f. source that supplies sufficient power to the discharge to excite and maintain the discharge, the method being performed with a variable frequency r.f. source that drives a load including the discharge via a matching network, the method comprising adjusting the frequency of the source until there is a minimum reactive component seen looking into the matching network form the direction of the source, and delivering a predetermined amount of power to the load by controlling the source output power in response to a measure of power reflected from the load back toward the source.

10. The method of claim 9 wherein the source power is varied only after the frequency supplied to the load has been stabilized.

11. The method of claim 9 wherein the source power is controlled by comparing the amount of power delivered to the load relative to a set point value therefor to derive an error indication, and controlling the amount of power derived from the source in response to the error indication.

12. The method of claim 9 wherein the source power is controlled by combining indications of the amount of power derived from the source, the amount of power reflected back to the matching network from the load and a set point value for the load power.

13. A method of matching a load including a plasma discharge in a vacuum plasma processing chamber to an r.f. source that supplies sufficient power to the discharge to excite and maintain the discharge, the method being performed with a variable frequency r.f. source that drives a load including the discharge via a matching network, the method comprising adjusting the frequency of the source until there is a minimum reactive component seen looking into the matching network from the direction of the source, and delivering a predetermined amount of power to the load by controlling a variable impedance of a matching network connected between the source and load.

14. In combination,
    a vacuum plasma processing chamber for generating a plasma discharge for treating a workpiece;
    a variable frequency r.f. source in the low megahertz non-microwave range for deriving sufficient power to excite and maintain the discharge;
    a matching network connected between the r.f. source and a load including the plasma of the discharge chamber; and
    a controller responsive to a function of power reflected from the load back toward the source for controlling the frequency supplied by the source to the matching network, the controller including an electronic phase detector for deriving a first signal indicative of the phase difference between the voltage and current derived by the source, the controller being responsive to the first signal for deriving a second signal, the variable frequency source being responsive to the second signal so the second signal controls the frequency derived by the variable frequency source.

15. The combination of claim 14 wherein the variable frequency r.f. source includes an electronically tuned voltage controlled oscillator.

16. The combination of claim 15 wherein the matching network includes reactances having only fixed values.

17. The combination of claim 15 wherein the variable frequency r.f. source includes a power amplifier responsive to the oscillator and having a bandpass at least equal to the range of frequencies that can be derived by the oscillator.

18. In combination, a vacuum plasma processing chamber for generating a plasma discharge for treating a workpiece;
    a variable frequency r.f. source for deriving sufficient power to excite and maintain the discharge;
    a matching network connected between the r.f. source and a load including the plasma of the discharge chamber; and
    a controller responsive to a function of power reflected from the load back toward the source for controlling the frequency supplied by the source to the matching network, the controller being arranged to respond to power reflected from the load toward the source so a predetermined amount of power is delivered to the load, the controller being arranged to control the source so a predetermined amount of power is delivered to the load only after the frequency supplied to the load has been stabilized.

19. In combination, a vacuum plasma processing chamber for generating a plasma discharge for treating a workpiece;
    a variable frequency r.f. source for deriving sufficient power to excite and maintain the discharge;
    a matching network connected between the r.f. source and a load including the plasma of the discharge chamber; and
    a controller responsive to a function of power reflected from the load back toward the source for controlling the frequency supplied by the source to the matching network, the controller being arranged to respond to sower reflected from the load toward the source so a predetermined amount of power is delivered to the load, the controller being arranged to (a) detect the amount of power delivered to the load by determining the difference between the source output power supplied toward the load and the power reflected from the load back to the source, (b) compare the amount of power delivered to the load relative to a set point value therefor to derive an error indication, and (c) control the amount of power derived from the source in response to the error indication.

20. In combination,
    a vacuum plasma processing chamber for generating a plasma discharge for treating a workpiece;
    a variable frequency r.f. source for deriving sufficient power to excite and maintain the discharge;
    a matching network connected between the r.f. source and a load including the plasma of the discharge chamber; and
    a controller responsive to a function of power reflected from the load back toward the source for controlling the frequency supplied by the source to the matching network, the matching network including a variable reactance, and the controller being arranged to control the value of the variable reactance until a predetermined amount of power is delivered to the load.

21. Apparatus for generating a plasma discharge for treating a workpiece in a vacuum plasma processing chamber comprising
    a variable frequency r.f. source in the low megahertz non-microwave range for deriving sufficient power to excite and maintain the discharge while the discharge processes the workpiece;
    a matching network connected between the r.f. source and a load including the plasma of the discharge chamber;
    a controller responsive to a function of power reflected from the load back toward the source for controlling the frequency supplied by the source to the matching network,
    the controller being arranged to control the frequency supplied by the source to the matching network so there is a minimum phase difference between the voltage and current supplied by the source to the load, the controller including an electronic phase detector for deriving a first signal indicative of the phase difference between the voltage and current supplied by the source to the load, and an electronic proportional-integral controller responsive to the first signal for deriving a second signal, the variable frequency r.f. source being a voltage controlled oscillator responsive to the second signal so the second signal controls the frequency derived by the oscillator.

22. Apparatus for driving a vacuum plasma processing chamber for generating a plasma discharge for treating a workpiece comprising
    a variable frequency r.f. source for deriving sufficient power to excite and maintain the discharge;
    a matching network connected between the r.f. source and a load including the plasma of the discharge chamber; and
    a controller responsive to a function of power reflected from the load back toward the source for controlling the frequency supplied by the source to the matching network, the controller responding to power reflected from the load toward the source, the controller being arranged to control the source output power so a predetermined amount of power is delivered to the load, the controller being arranged to control the source so the predetermined amount of power is delivered to the load only after the frequency supplied to the load has been stabilized.

23. Apparatus for driving a vacuum plasma processing chamber for generating a plasma discharge for treating a workpiece comprising a variable frequency r.f. source for deriving sufficient power to excite and maintain the discharge;

a matching network connected between the r.f. source and a load including the plasma of the discharge chamber; and a controller responsive to a function of power reflected from the load back toward the source for controlling the frequency supplied by the source to the matching network, the controller responding to power reflected from the load toward the source, the controller being arranged to control the source output power so a predetermined amount of power is delivered to the load, the controller being arranged to (a) detect the amount of power delivered to the load by determining the difference between the source output power supplied toward the load and the power reflected from the load back to the source, (b) compare the amount of power delivered to the load relative to a set point value therefor to derive an error indication, and (c) control the amount of power derived from the source in response to the error indication.

24. Apparatus for deriving a vacuum plasma processing chamber for generating a plasma discharge for treating a workpiece comprising a variable frequency r.f. source for deriving sufficient power to excite and maintain the discharge;

a matching network connected between the r.f. source and a load including the plasma of the discharge chamber; and a controller responsive to a function of power reflected from the load back toward the source for controlling the frequency supplied by the source to the matching network, the matching network including a variable reactance, and the controller being arranged to control the value of the variable reactance until a predetermined amount of power is delivered to the load.

25. In combination, a vacuum plasma processing chamber for generating a plasma discharge for treating a workpiece;

an r.f. source for deriving sufficient power to excite and maintain the discharge;

a matching network connected between the r.f. source and a load including the plasma of the discharge chamber; and a controller (a) responsive to the amount of power reflected back to the source from the load for deriving a signal commensurate with the amount of power supplied by the source to the load and, (b) responsive to the signal for maintaining the amount of power supplied to the load equal to a set point.

26. The combination of claim 25 wherein the controller combines signals commensurate with output power of the r.f. source and power reflected from the load to derive the signal commensurate with the amount of power supplied by the source to the load.

27. The combination of claim 25 wherein the controller combines signals responsive to and commensurate with detected output power of the r.f. source and detected power reflected from the load to derive the signal commensurate with the amount of power supplied by the source to the load.

28. Apparatus for controlling the amount of power supplied to a vacuum plasma processing chamber for generating a plasma discharge for treating a workpiece comprising an r.f. source for deriving sufficient power to excite and maintain the discharge;

a matching network connected between the r.f. source and a load including the plasma of the discharge chamber; and a controller (a) responsive to the amount of power reflected back to the source from the load for deriving a signal commensurate with the amount of power supplied by the source to the load and, (b) responsive to the signal for maintaining the amount of power supplied to the load equal to a set point.

29. The combination of claim 28 wherein the controller combines signals commensurate with output power of the r.f. source and power reflected from the load to derive the signal commensurate with the amount of power supplied by the source to the load.

30. The combination of claim 28 wherein the controller combines signals responsive to and commensurate with detected output power of the r.f. source and detected power reflected from the load to derive the signal commensurate with the amount of power supplied by the source to the load.

31. A memory for controlling matching of an r.f. source to a load including a vacuum plasma processing chamber, the source being connected to the chamber via a matching network, the memory being part of a digital controller including a processor, the processor being responsive to first and second signals that are respectively functions of power supplied by the source to the matching network and power reflected from the load and having an output connected to a frequency control element of the source, the memory comprising storage elements storing additional signals which are derived in response to first and second signals, the additional signals controlling the processor so the frequency control element of the source is supplied with a signal for causing the frequency of the source to be at a value which causes the reflected power to be substantially minimized.

* * * * *

UNITED STATES PATENT AND TRADEMARK OFFICE
CERTIFICATE OF CORRRECTION

PATENT NO. : 5,892,198
DATED : April 6, 1999
INVENTOR(S) : Michael S. Barnes, et al.

It is certified that error appears in the above-identified patent and that said Letters Patent is hereby corrected as shown below:

On the title page, insert the following, in item [56]:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 5 | 1 | 7 | 5 | 4 | 7 | 2 | Dec. 29, 1992 | | | | Dec. 30, 1991 |
| | | 5 | 4 | 7 | 4 | 6 | 4 | 8 | Dec. 12, 1995 | | | | Jul. 29, 1994 |
| | | 5 | 5 | 5 | 6 | 5 | 4 | 9 | Sep. 17, 1996 | | | | May 2, 1994 |

Signed and Sealed this

Twenty-sixth Day of October, 1999

*Attest:*

Q. TODD DICKINSON

*Attesting Officer*  *Acting Commissioner of Patents and Trademarks*